United States Patent
Cheung et al.

(10) Patent No.: US 6,181,158 B1
(45) Date of Patent: *Jan. 30, 2001

(54) CONFIGURATION LOGIC TO ELIMINATE SIGNAL CONTENTION DURING RECONFIGURATION

(75) Inventors: Edmond Y. Cheung, San Jose; Charles R. Erickson, Fremont, both of CA (US)

(73) Assignee: Xilinx, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/018,277

(22) Filed: Feb. 4, 1998

Related U.S. Application Data

(63) Continuation-in-part of application No. 08/847,326, filed on Apr. 23, 1997, now Pat. No. 5,770,951, which is a continuation of application No. 08/569,758, filed on Dec. 8, 1995, now abandoned, which is a division of application No. 08/375,763, filed on Jan. 20, 1995, now Pat. No. 5,592,105.

(51) Int. Cl.$^7$ .............................. H03K 19/177; G11C 8/04
(52) U.S. Cl. ................................ 326/38; 326/46; 365/240
(58) Field of Search .......................... 326/38, 46, 39–40; 365/240; 377/69, 75

(56) References Cited

U.S. PATENT DOCUMENTS

| | | | |
|---|---|---|---|
| 4,758,985 | * 7/1988 | Carter | 326/40 |
| 4,899,307 | * 2/1990 | Lenoski | 365/240 |
| 4,961,169 | * 10/1990 | Matsumura et al. | 365/240 |
| 4,969,126 | * 11/1990 | Maeno | 365/240 |
| 4,975,640 | 12/1990 | Lipp | 324/158 R |
| 5,255,220 | * 10/1993 | Filliman | 365/240 |
| 5,282,234 | 1/1994 | Murayama et al. | 377/69 |
| 5,291,457 | * 3/1994 | Asato et al. | 365/240 |
| 5,363,424 | 11/1994 | Fujisawa | 377/69 |
| 5,770,951 | * 6/1998 | Cheung et al. | 326/38 |

FOREIGN PATENT DOCUMENTS

| | | | |
|---|---|---|---|
| 227597 | 1/1990 | (JP) | 377/69 |

OTHER PUBLICATIONS

IBM Technical Disclosure, vol. 28, No. 1, Jun. 1985, pp. 44–46.

* cited by examiner

*Primary Examiner*—Jon Santamauro
(74) *Attorney, Agent, or Firm*—Bever, Hoffman & Harms, LLP; Jeanette S. Harms; Lois D. Cartier

(57) ABSTRACT

A structure for providing clearing/programming includes a plurality of synchronous flip-flops, and a plurality of associated two-input multiplexers. A control signal in a first logic state provided to the multiplexers provides a first signal propagation direction through the flip-flops, whereas the control signal in a second logic state provides a second signal propagation direction through the flip-flops. One method for clearing and programming a programmable logic device includes arranging a plurality of memory cells in sets, clearing the sets in a first spatial sequence, and programming the sets in a second spatial sequence. Sets of memory cells could include columns of memory cells, each column having an associated storage element. In this manner, a plurality of columns of memory cells can be cleared or programmed in any predetermined order. Thus, a method for programming a logic device may include programming a plurality of columns of memory cells in a first direction, and then programming a another plurality of columns of memory cells in a second direction. A reverse order is preferably used for clearing that logic device. Note that within one plurality of columns, any spatial sequence could be provided.

5 Claims, 4 Drawing Sheets

CONFIGURATION LOGIC TO ELIMINATE SIGNAL CONTENTION DURING RECONFIGURATION

RELATED APPLICATIONS

The present application is a continuation-in-part application of Ser. No. 08/847,326, filed Apr. 23, 1997, now U.S. Pat. No. 5,770,951, which is a file wrapper continuation of Ser. No. 08/569,758, filed Dec. 8, 1995, abandoned, which is a divisional of Ser. No. 08/375,763, filed Jan. 20, 1995, issued as U.S. Pat. No. 5,592,105 on Jan. 7, 1997.

FIELD OF THE INVENTION

1. Background of the Invention

The present invention relates to configuration logic, and in particular to configuration logic to eliminate signal contention during reconfiguration.

2. Description of the Related Art Configuration logic is well known in the art of programmable logic devices (PLDs). FIG. 1 illustrates a simple multiplexer 10 having three input signals I1, I2, and I3. Configuration memory cells 1, 2, and 3 provide their stored values to transistors T1, T2, and T3, respectively. Typically, memory cells 1, 2, and 3 comprise static random access memory (SRAM) cells which are well known in the art. To avoid signal contention on multiplexer output line 7, only one transistor is turned on at any one time.

FIG. 2 illustrates another multiplexer 20 having six input signals I1-I6. Configuration memory cells 1, 2, 3, and 4 provide their stored values to transistors T1A/T1B, T2A/T2B, T3A/T3B, and T4A/T4B, respectively. To avoid signal contention on multiplexer output line 7, only three transistors are turned on at any one time. Specifically, only two transistors of transistors T1A/T1B, T2A/T2B, and T3A/T3B are conducting at a time, and either transistor T4A or transistor T4B is conducting.

Before configuration of multiplexers 10 and 20, one input signal must be designated as the default input signal (i.e. the designated signal provided to output line 7). This designation ensures that there are no floating gates in inverter 5 and no undefined state for inverter 6, thereby ensuring the PLD is initially configured to a known state. In a typical PLD, all memory cells are initialized to logic zeros. To designate the default input signal in multiplexer 10, the signal of memory cell 1 is inverted, thereby ensuring that transistor T1 is conducting after initialization. Thus, signal I1 is designated the default input signal. Similarly to designate the default input signal in multiplexer 20, one signal from memory cell 4 and the signal of memory cell 1 are inverted. Thus, signal I1 is also designated the default input signal in multiplexer 20.

If a user desires input signal I3 (or I2) to be the signal provided on output line 7, transistor T1 must be turned off before transistor T3 (or T2) is turned on. Thus, memory cell 1 must be programmed no later than memory cells 2 and 3. However, before another configuration pattern can be implemented, all memory cells must be set to zero (referred to as memory initialization).

In a PLD configuration, the memory cells are typically arranged in groups. During memory initialization, memory cells are set to zero in a systematic manner, typically group by group progressing from right to left (commonly referred to as "housecleaning"). Because the memory cells associated with the default signals (i.g. the memory cells having associated inverters) are positioned to the right of the other memory cells (see FIGS. 1 and 2), this memory initialization results in signal contention. For example, referring to FIG. 1, memory cell 1 if set to zero turns on transistor T1 which then begins to conduct before memory cell 3 is set to zero. Thus, both transistors T1 and T3 are conducting during the same period, thereby creating a signal contention on output 7.

One solution to this contention problem is to force all input signals to zero when a memory initialization occurs. However, this solution disadvantageously adds logic to the PLD, thereby significantly increasing the silicon area required for the PLD. Moreover, the added logic decreases performance of the PLD itself.

Another solution is to disconnect all lines from all drivers when memory initialization occurs. As is well known in the art, a signal on output line 7 subsequently drives other circuits and devices in the PLD. To avoid signal contention, a pass transistor T5 (shown for illustration in FIG. 1) must be placed on output line 7, thereby allowing output line 7 to be disconnected (by providing a logic zero signal 11) during memory initialization. However, this solution also adds logic to the PLD which undesirably increases the silicon required to implement the PLD. Additionally, this added logic significantly deteriorates the performance of the PLD.

Therefore, a need arises for a configuration method and structure which prevents signal contention during memory initialization without adversely affecting either silicon area or PLD performance.

SUMMARY OF THE INVENTION

In accordance with one embodiment of the present invention, a structure for providing the clearing and/or programming includes a plurality of synchronous storage elements and a plurality of associated two-input multiplexers. A control signal in a first logic state provided to the multiplexers provides a first signal propagation direction through the storage elements and the control signal in a second logic state provided to the multiplexers provides a second signal propagation direction through the storage elements. In one embodiment, the storage elements are flip-flops, wherein a multiplexer selectively provides (1) a signal from the Q-output terminal of a first flip-flop, or (2) a signal from the Q-output terminal of a second flip-flop or a token signal.

One method for clearing and programming a programmable logic device includes arranging a plurality of memory cells in sets, clearing the sets in a first spatial sequence, and programming the sets in a second spatial sequence, wherein the first spatial sequence is different than the second spatial sequence. In one case, the spatial sequence is a linear progression across the device. A spatial sequence during programming which is the reverse order of the spatial sequence during clearing prevents signal contention. Thus, the present invention provides the flexibility of clearing or programming sets of memory cells in predetermined areas of the device before other areas.

In accordance with another embodiment of the present invention, sets of memory cells could include columns of memory cells, each column having an associated storage element. In this manner, a plurality of columns of memory cells can be cleared or programmed in any predetermined order. Thus, a method for programming a logic device may include programming a plurality of columns of memory cells in a first direction, and then programming another plurality of columns of memory cells in a second direction. A reverse order is preferably used for clearing that logic device. Note that within one plurality of columns, any spatial sequence could be provided.

DETAILED DESCRIPTION OF THE DRAWINGS

Figure 1:
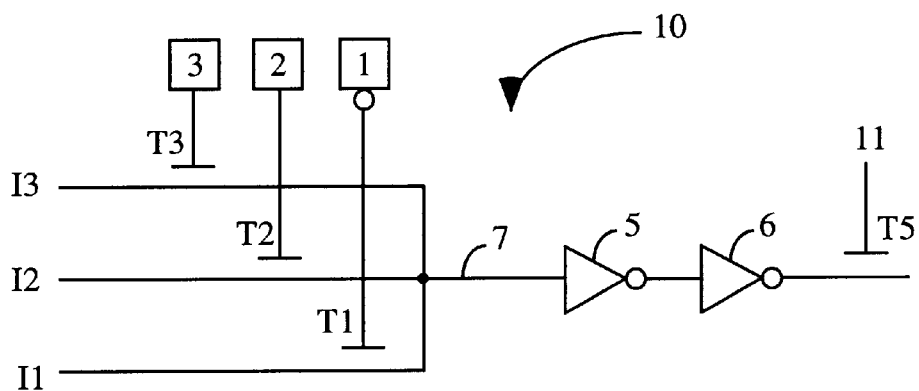
FIG. 1 illustrates a simple multiplexer having three input signals.
Figure 2:
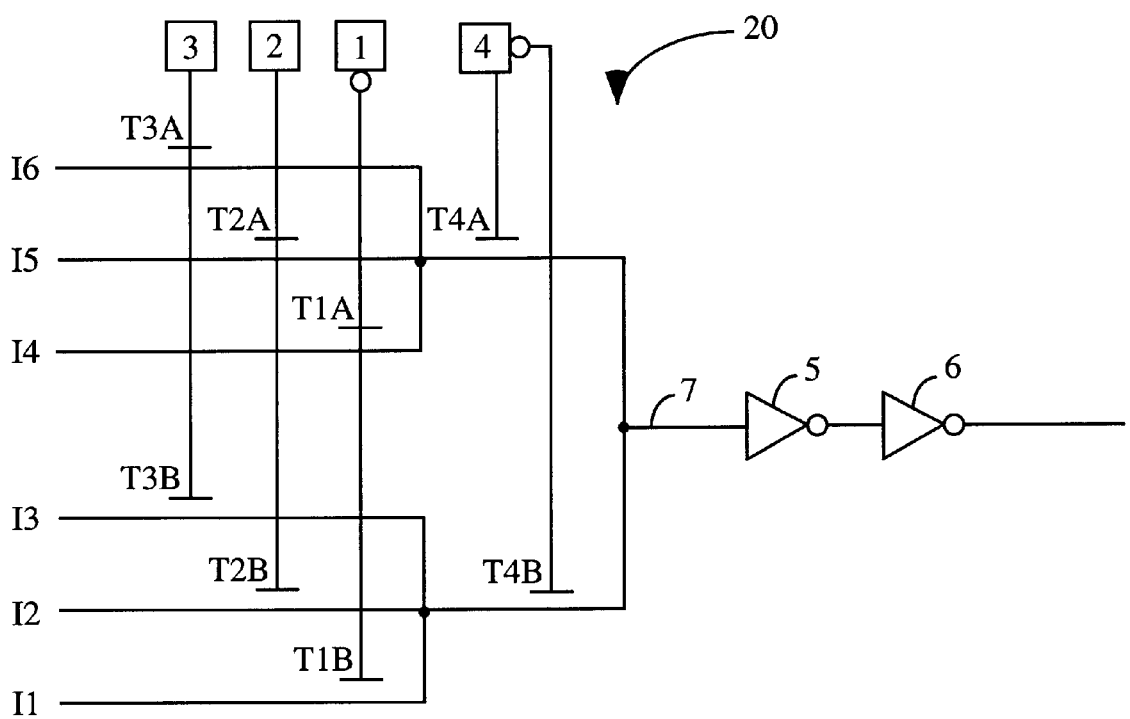
FIG. 2 shows another multiplexer having six input signals.
Figure 3:
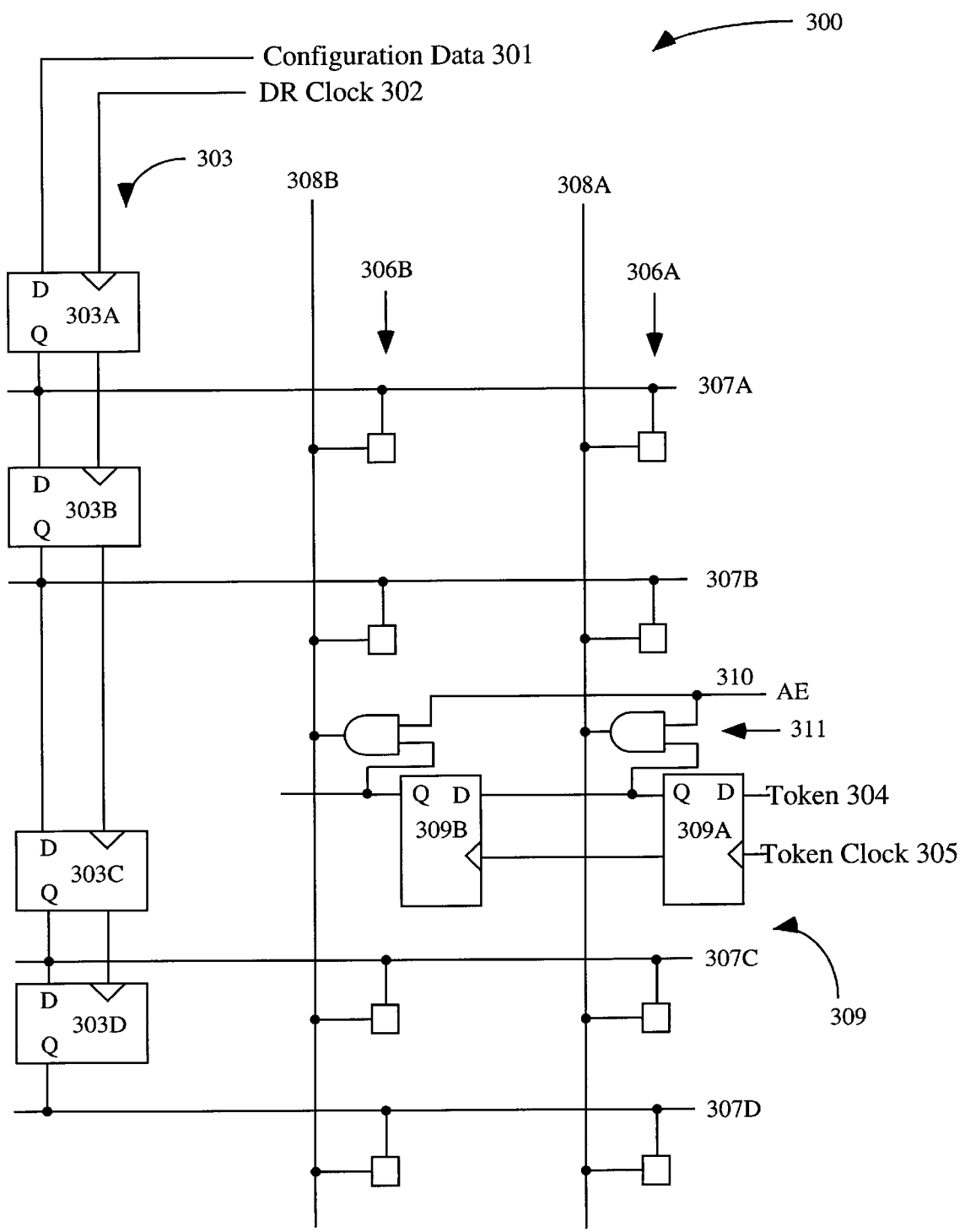
FIG. 3 shows an illustrative configuration logic structure for a field programmable gate array.

FIG. 3 illustrates a typical configuration memory circuit 300 for a PLD. Circuit 300 includes a memory cell array organized into sets of memory cells (i.e. sets 306A and 306B). Sets 306A and 306B of memory cells are coupled to associated access lines 308A and 308B, respectively. A token register 309, which includes a plurality of D flip-flops 309A and 309B, is positioned in the middle of the memory cell array. To configure the memory array, the following steps are provided.

In the first step, all configuration bits for the memory cells in set 306A (which are coupled to access line 308A) are loaded in data register 303 via configuration data line 301 and data register clock line 302. Specifically, a signal on data register clock line 302 clocks each stored configuration bit into the D-input terminal of the next flip-flop 303. For example, during one clock cycle, a stored bit on the D-input terminal of flip-flop 303A is transferred to its Q-output terminal which in turn is transferred to the D-input terminal of flip-flop 303B. Detect circuitry (not shown) determines when all configuration bits have been loaded, i.e. when the configuration bit for memory cell 306A on data line 307D is stored in flip-flop 303D.

In the second step, a logic one signal is provided on token line 304 to the D-input terminal of flip-flop 309A. Token clock 305 clocks that logic one signal to the Q-output terminal of flip-flop 309A which is then transferred to the D-input terminal of 309B. Assuming that the access enable (AE) signal is active (i.e. in this embodiment a logic one signal) on line 310, the logic one signal is provided on access line 308A via logic circuitry 311, thereby accessing all memory cells 306A. At this point, the signals stored in flip-flops 303A–303D program memory cells 306A from data lines 307A–307D, respectively.

In the third step, an inactive access enable (AE) signal is provided on line 310, thereby preventing any memory cells 306A from being accessed. Then, all configuration bits for the memory cells of set 306B (which are coupled to access line 308B) are loaded in data register 303 via configuration data line 301 and data register clock line 302 in the same manner described above for memory cells 306A.

The next signal provided on token line 304 (and all subsequent signals if circuit 300 includes a larger array of memory cells) is a logic zero signal. In this manner, after the next clock signal and an enabling access enable (AE) signal is provided on token clock line 305 and access enable line 310, respectively, only the memory cells of set 306B are accessed (i.e. receive a logic one signal) via access line 308B. At this point, the signals stored in flip-flops 303A–303D program memory cells 306B from data lines 307A–307D, respectively. Thus, as shown in FIG. 3, the configuration bits for circuit 300 are loaded by sets of memory cells, progressing right to left. Note that although only a 4×2 memory cell array is shown, the same method is typically used for arrays of larger dimensions.

Figure 4:
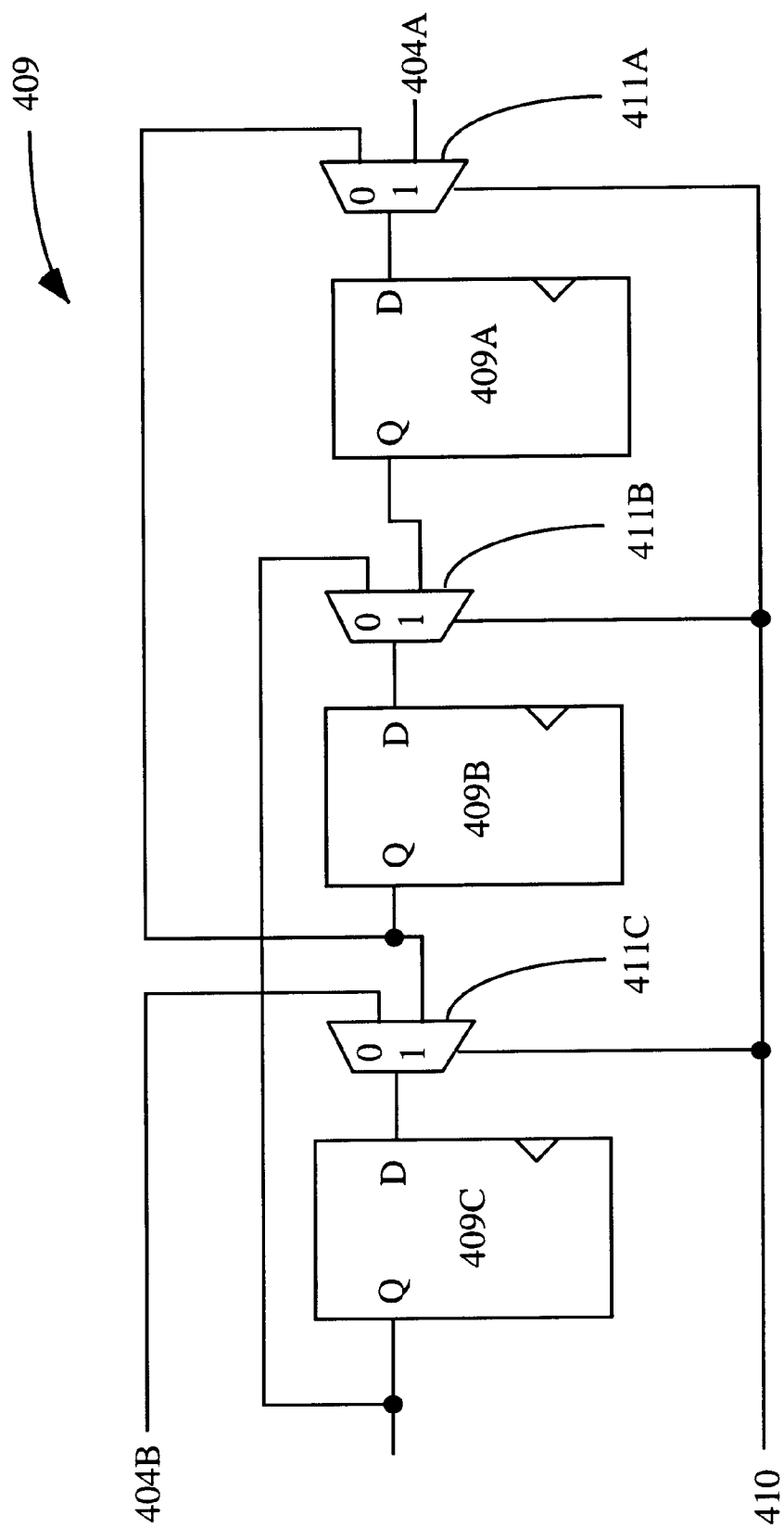
FIG. 4 illustrates a configuration logic structure in accordance with the present invention.

In accordance with the present invention and referring to FIG. 4, token register 409 includes flip-flops 409A–409C having associated multiplexers 411A–411C, respectively. Note that flip-flops 409A–409C are coupled to logic circuitry (which receives an access enable signal) (not shown) as well as to a plurality of access lines in the memory cell array (i.e. each flip-flop output line is coupled to a respective access line, but is not shown for simplicity). In this embodiment, a multiplexer selectively provides (1) a signal from the Q-output terminal of a first adjacent flip-flop, or (2) a signal from the Q-output terminal of a second adjacent flip-flop or a token signal. For example, multiplexer 411B selectively provides a signal from the Q-output terminal of adjacent flip-flop 409A or a signal from the Q-output terminal of another adjacent flip-flop 409C. Multiplexers 411A and 411C, associated with the end flip-flops of register 409, receive signals from their adjacent flip-flops and token signals on lines 404A and 404B, respectively.

A signal provided on line 410 determines whether a signal provided on token line 404A or token line 404B is clocked through register 409. For example, in one embodiment of the present invention, if a logic one signal is provided on line 410, then the signal on token line 404A is transferred from right to left as described above in reference to FIG. 3. However, if a logic zero signal is provided on line 410, then the token signal (i.e. a logic one signal) provided on token line 404B is transferred to the D-input terminal of 409C. During the next clock cycle that token signal is transferred to the Q-output terminal of flip-flop 409C and subsequently to the D-input terminal of flip-flop 409B via multiplexer 411B. During a next clock cycle that token signal is transferred to the Q-output terminal of flip-flop 409B and subsequently to the D-input terminal of flip-flop 409A via multiplexer 411A. Thus, sets of memory cells are accessed and configured in a direction from left to right.

Multiplexers 411 occupy relatively little space in token register 409 and, thus, do not significantly increase silicon area. Moreover, multiplexers 411 are not built into any user programmable circuits and thus do not adversely affect performance of the user's circuit.

Figure 5A:
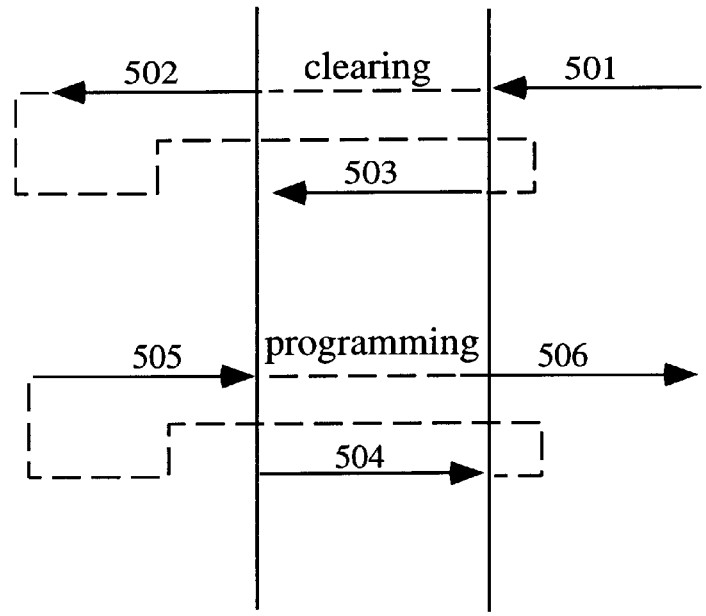
FIG. 5A illustrates spatial sequences for clearing and programming a plurality of memory cells.

Note that although FIG. 4 illustrates flip-flop 409B as being located between flip-flops 409A and 409C, the actual physical locations are arbitrary. Thus, flip-flop 409B could be physically located to the left of flip-flop 409C. As shown in FIG. 5A, the memory cell sets associated with register 409 could be cleared in spatial sequence 501, 502, and 503, then programmed in spatial sequence 504, 505, and 506 (reverse order), thereby preventing signal contention during reconfiguration. Assuming that flip-flop 409B is physically located between flip-flops 409A and 409C, the spatial sequence is a linear progression across the device.

Figure 5B:
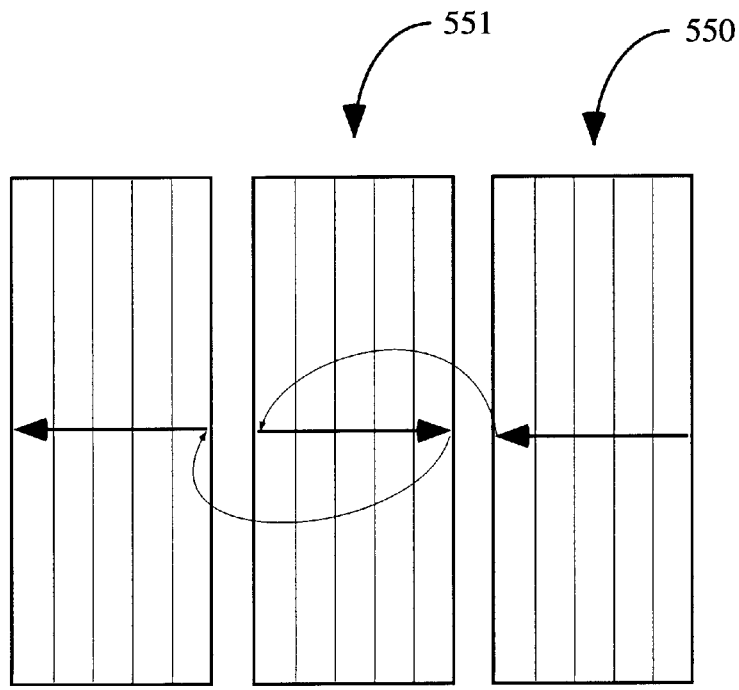
FIG. 5B illustrates a method of programming a set of memory cells in first direction and programming another set of memory cells in a second direction.

Those skilled in the art will also recognize that sets of memory cells could include columns of memory cells, each column having an associated storage element. Therefore, columns of memory cells can be cleared or programmed in any predetermined order. Thus, referring to FIG. 5B, a method for programming a logic device may include programming at least one set (columns 550) of memory cells in a first direction, and programming at least one other set (columns 551) in a second direction. A reverse order is preferably used for clearing that logic device.

Although the present invention is described in reference to only one embodiment, those skilled in the art will recognize variations in the structure of the token register and in the method of propagating the token signal thorough the token register. The present invention is set forth in the appended claims.

What is claimed is:

1. A method for clearing and programming a logic device including the steps of:

arranging a plurality of memory cells in sets;

clearing said sets in a first spatial sequence; and programming said sets in a second spatial sequence, wherein said first spatial sequence is different than said second spatial sequence.

2. The method of claim 1 wherein the second spatial sequence is the reverse order of the first spatial sequence.

3. A method for clearing and programming a logic device including the steps of:

arranging a plurality of memory cells in sets;

clearing said sets in a first direction; and programming said sets in a second direction, wherein said first direction is different than said second direction.

4. A method for programming a logic device including the steps of:

arranging a first plurality of memory cells in a first set;

arranging a second plurality of memory cells in a second set;

programming the first plurality of memory cells in a first spatial sequence; and programming the second plurality of memory cells in a second spatial sequence, wherein said first spatial sequence is different than said second spatial sequence.

5. A method for clearing a logic device including the steps of:

arranging a first plurality of memory cells in a first set;

arranging a second plurality of memory cells in a second set;

clearing the first plurality of memory cells in a first spatial sequence; and clearing the second plurality of memory cells in a second spatial sequence, wherein said first spatial sequence is different than said second spatial sequence.

* * * * *